(12) United States Patent
Lin

(10) Patent No.: US 6,599,823 B1
(45) Date of Patent: Jul. 29, 2003

(54) METHOD FOR IMPROVING PACKAGE BONDING BETWEEN MULTI-LEVEL INTERCONNECTION LINES AND LOW K INTER-METAL DIELECTRIC

(75) Inventor: Chien-Hsing Lin, Taichung (TW)

(73) Assignee: United Microelectronics Corp. (TW)

( * ) Notice: Subject to any disclaimer, the term of this patent is extended or adjusted under 35 U.S.C. 154(b) by 153 days.

(21) Appl. No.: 09/695,162

(22) Filed: Oct. 24, 2000

(51) Int. Cl.⁷ ............................................. H01L 21/4763
(52) U.S. Cl. ........................ 438/618; 438/627; 438/624
(58) Field of Search ................................ 438/618, 627, 438/624

(56) References Cited

U.S. PATENT DOCUMENTS 6,016,000 A * 1/2000 Moslehi
6,180,976 B1 * 1/2001 Roy

* cited by examiner

*Primary Examiner*—John E Niebling
*Assistant Examiner*—Stanetta Isaac

(57) ABSTRACT

A method for improving package bonding between multi-level interconnection lines and low K inter-metal dielectric is provided. The present invention includes the steps of forming a trench between each pair of interconnection lines on one level of multi-level interconnection lines, and then filling the trench with an oxide dielectric material, instead of the low K inter-metal dielectric having a K value smaller than 3 filled therein before the trench formation. Since the oxide dielectric material has a K value higher than the low K inter-metal dielectric, the oxide dielectric is hard enough to resist the force of the package bonding. Accordingly, the relibility of bondability between the multi-level interconnection lines and the low K inter-metal dielectric is enhanced.

30 Claims, 4 Drawing Sheets

METHOD FOR IMPROVING PACKAGE BONDING BETWEEN MULTI-LEVEL INTERCONNECTION LINES AND LOW K INTER-METAL DIELECTRIC

BACKGROUND OF THE INVENTION

1. Field of the Invention

The present invention relates to a method for fabricating multi-level interconnection lines, and relates more particularly to a method for improving bond structure formed of multi-level interconnection lines and low K inter-metal dielectric, especially fabricated by a dual damascene process.

2. Description of the Prior Art

Many highly integrated semiconductor circuits utilize multi-level wiring line structures for interconnecting regions within devices and for interconnecting one or more devices within the integrated circuit. In forming such structures, it is conventional to provide first or lower level wiring lines or interconnect structures and then to form a second level wiring lines in contact with the first level wiring lines or interconnect structures. A first level interconnect might be formed in contact with a doped region within the substrate of an integrated circuit device. Alternatively, a first level interconnect might be formed to a polysilicon or metal wiring lines that is in contact with one or more device structure in or on the substrate of the integrated circuit device. One or more interconnections are typically formed between the first level wiring lines or interconnect and other portions of the integrated circuit device or to structures external to the integrated circuit. This is accomplished, in part, through the second level of wiring lines.

A dual damascene process is intensively developed to provide a more stable and more advanced method of fabricating interconnects in an integrated circuit. By using a chemical mechanical polishing process during the dual damascene process, a greater variety of metals such as aluminum, copper and aluminum alloy can be selected without being restricted by the conventional etching process. Selecting from a greater variety of metals is advantageous to the requirement of low resistance interconnects, and is also advantageous in preventing electromigration.

However, as the dimension of devices on a chip becomes smaller and smaller, the density of interconnect pitch is higher and higher. For a common dielectric layer, for example, a silicon dioxide layer, due to the high dielectric constant, a higher RC delay is easily caused. Therefore, this kind of dielectric layer is not used as an inter-metal dielectric (IMD) in an integrated circuit with high density. To apply a low K dielectric layer has an advantage such as reducing the interconnection parasitic capacitance, consequently reducing the RC delay, or mitigating the cross talk between the metal lines, hence, the operation is improved.

While, as shown in FIG. 1, a bond structure fabricated by a dual damascene process, which consists of a plurality of alternative multi-level copper interconnection lines and via layers filled with copper and a low K dielectric filled therein as the inter-metal dielectric, encounters the issue of bondability between the copper interconnection line and the low K dielectric. The low K dielectric, such as low K spin-on glass (SOG), is intrinsically too soft to resist the force of the package bonding of the bond structure, and the poor adhesion between copper and the low K SOG actually does not endure the pulling force from the package equipment during proceeding package bonding.

Accordingly, it is desirable to develop a method for improving package bonding of the multi-level interconnection lines and the low K inter-metal dielectric.

SUMMARY OF THE INVENTION

It is one object of the present invention to provide a method for improving package bonding between multi-level interconnection lines and low K inter-metal dielectric, in which a trench is formed between each pair of the interconnection lines on one level of the multi-level interconnection lines, and then filling the trench with an oxide dielectric instead of the low K inter-metal dielectric filled therein before. The oxide dielectric is hard enough to resist the force of the package bonding, and hence the relibility of bondability for the interconnection line and the low K inter-metal dielectric is improved.

It is another object of the present invention to provide a method for improving package bonding between multi-level interconnection lines and low K inter-metal dielectric, in which an oxide dielectric is used instead of one portion of the low K inter-metal dielectric filled in the multi-level interconnection lines structure. Thereby, the oxide dielectric can enhance adhesion between the interconnection lines and the low K inter-metal dielectric, and endure the pulling force from the package equipment during proceeding package bonding.

It is a further object of the present invention to provide a method for improving package bonding between multi-level interconnection lines and low K inter-metal dielectric. The present method is simple and readily attained, and does not increase complexity of the original process.

In order to achieve the above objects, the present invention provides a method for improving package bonding between multi-level interconnection lines and low K inter-metal dielectric. Firstly, providing a semiconductor substrate with a layered structure having a top interconnection line layer, a bottom interconnection line layer and a plurality of alternative interconnection line layers and via layers formed therebetween, each of the vias being in alignment with one adjacent upper interconnection line and one adjacent lower interconnection line, wherein a low K dielectric material is filled in the layered structure as the inter-metal dielectric. Then, patterning the layered structure to form a trench between each pair of the adjacent interconnection lines on one layer of the layered structure. Subsequently, forming a first oxide layer over the layered structure to fill the trench formed therein and then planarizing the first oxide layer. Thereafter, forming a second oxide layer over the first oxide layer, and patterning the second oxide layer to form a plurality of openings each of which being in alignment with each of the top interconnection lines. Finally, forming a conductive layer over the second oxide layer to fill the openings to form a plurality of plugs, and then patterning the conductive layer to form a conductive pad across over each pair of the plugs formed within the second oxide layer. The first oxide dielectric is used instead of one portion of the low K dielectric in the multi-level interconnection lines structure. The first oxide dielectric is hard enough to resist the force of the package bonding between the multi-level interconnection lines and the low K dielectric, and thereby the reliability of bondability of the bond structure formed of the multi-level interconnection lines and the low K inter-metal dielectric is enhanced.

BRIEF DESCRIPTION OF THE DRAWINGS

The present invention can be best understood through the following description and accompanying drawings wherein.

DESCRIPTION OF THE PREFERRED EMBODIMENT

The preferred embodiment of this invention will be explained with reference to the drawings of FIG. 1 to FIG. 8.

The preferred embodiment provides a method for improving package bonding between multi-level interconnection lines and low K inter-metal dielectric. The bond structure formed of the multi-level interconnection lines and the low K inter-metal dielectric is fabricated by a dual damascene process. While the method provided by the preferred embodiment is not limited to the bond structure formed by the dual damascene process, any process providing a bond structure of multi-level interconnection lines and low K inter-metal dielectric is satisfied with the present invention.

Figure 1:
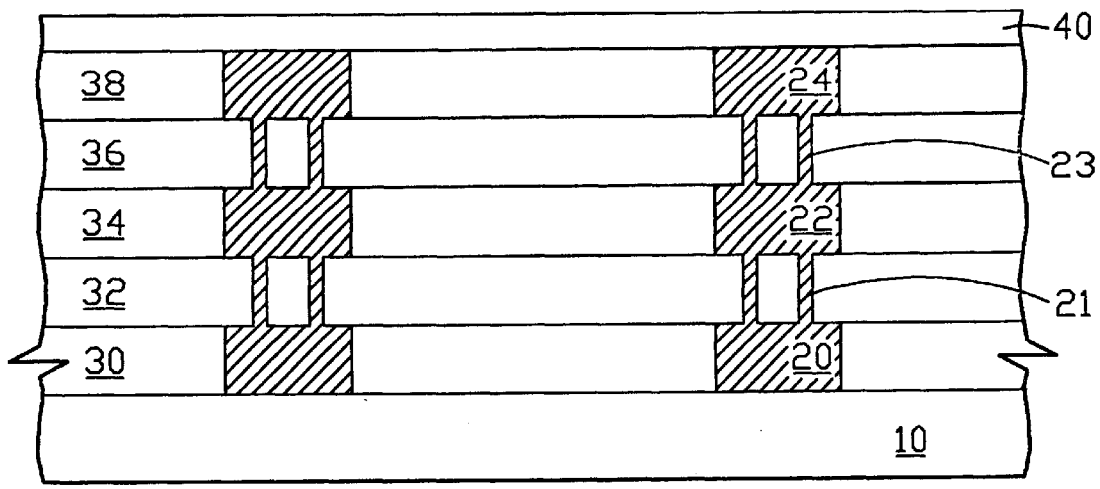
FIG. 1 to FIG. 8 shows schematically cross-sectional views of various steps of one embodiment according to the present invention.

Referring to FIG. 1, the first step is to provide a semiconductor substrate 10 with a layered structure formed of a plurality of alternative multi-level interconnection lines and via layer formed thereon. The layered structure has a bottom interconnection line layer 20, a top interconnection line layer 24 and a middle interconnection line layer 22, and via layers 21, 23 respectively formed between the bottom interconnection line layer 20, the middle interconnection line layer 22 and the top interconnection line layer 24. Each of the interconnection lines and the via's is formed of copper, aluminum/copper alloy or any conductive material having low resistance. A low K dielectric having a K value smaller than 3, such as spin-on low K organic dielectric, for example, flare, silk and parylene, and low K spin-on glass (SOG), is filled in the layered structure as the inter-metal dielectric 30, 32, 34, 36, 38. Thereafter, a dielectric layer 40 is formed on the top interconnection line layer 24. The dielectric layer 40, such as silicon nitride, for example, $Si_3N_4$ formed by low pressure CVD method, using $SiH_2Cl_2$/$NH_3$ as reaction gas at operation pressure 1~0.1 torr and temperature of 650~800° C., and SiNx (x=0.8~1.2) formed by plasma enhanced CVD method, using $SiH_4$/$NH_3$ as reaction gas at operation pressure 1-5 torr and temperature of 250~400° C., prevents the conductive material of the top interconnection line layer 24 from being oxidized during the following processes. Alternately, the dielectric layer 40 can be a silicon oxynitride (SiON) layer formed by plasma enhanced CVD method, utilizing mixture of $SiH_4$, $N_2O$ and $N_2$ as reaction gas.

Figure 2:
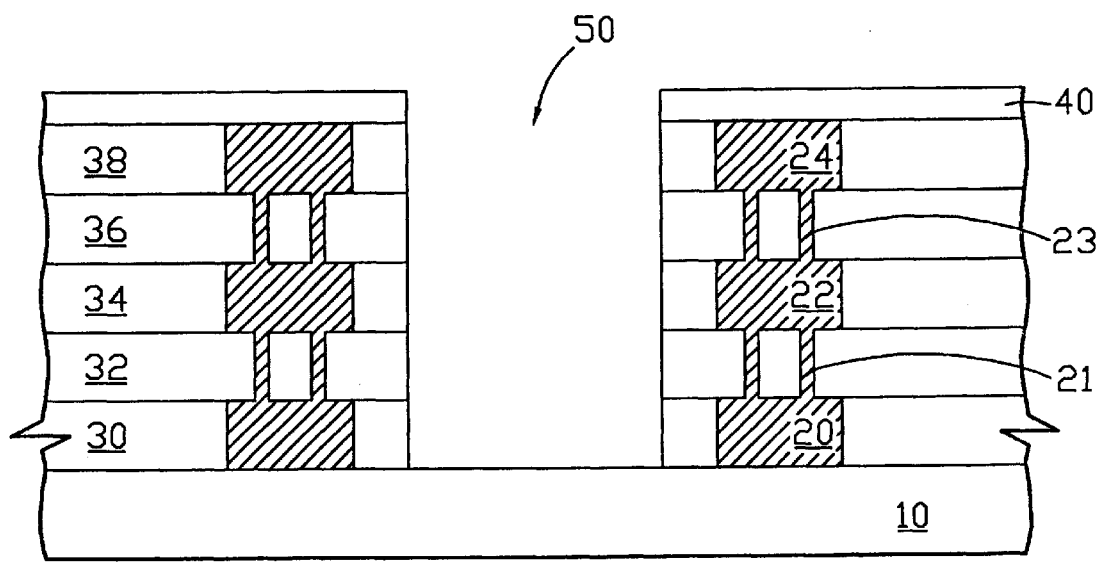

Referring to FIG. 2, a photoresist layer is formed on the dielectric layer 40, and then the dielectric layer 40 is patterned by way of photolithography and etching method, to form a trench 50 between each pair of the interconnection lines on the semiconductor substrate 10.

Figure 3:
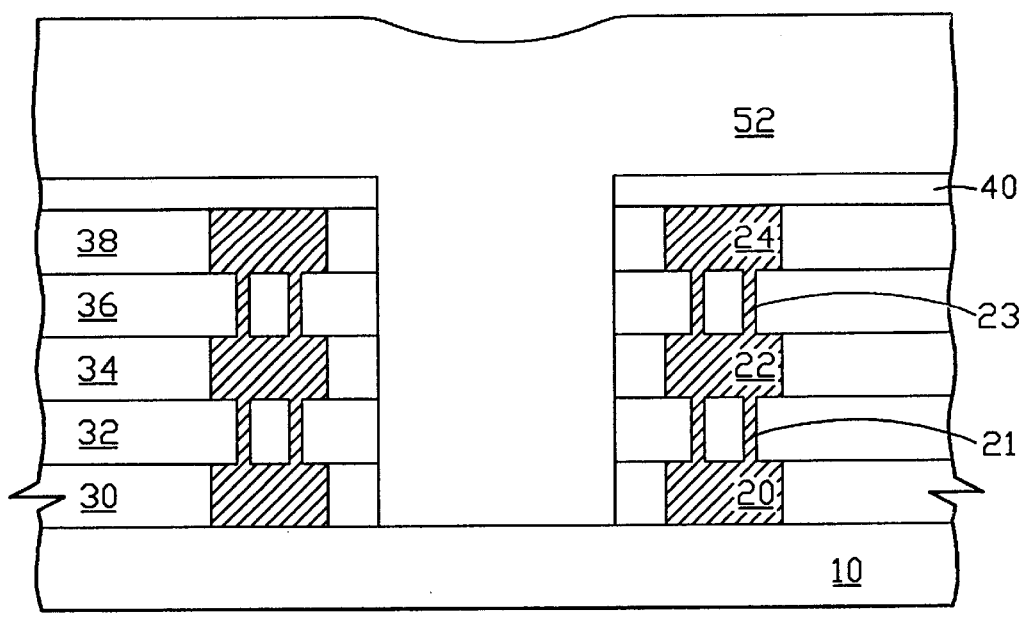

Referring to FIG. 3, after removing the photoresist layer, a first oxide layer 52 is formed over the dielectric layer 40 to fill the trench 50 and instead of the portion of the low K dielectric filled therein before forming the trench 50. The first oxide layer 52 can be a silicon dioxide layer, formed by low pressure CVD method, utilizing $TEOS/O_3$ as reaction gas at temperature of 650~750° C. The first oxide layer 52 also can be a PSG layer (the content of phosphorus atom is controlled in the range of about 6~8 wt. %) formed by atmospheric pressure CVD method, utilizing mixture of $SiH_4$, $PH_3$ and $O_2$ as reaction gas. In addition, the first oxide layer 52 can be a BPSG layer with the content of boron and phosphorus atoms controlled in the range of about 1~4 wt. % and 4~6 wt. %, respectively.

Figure 4:
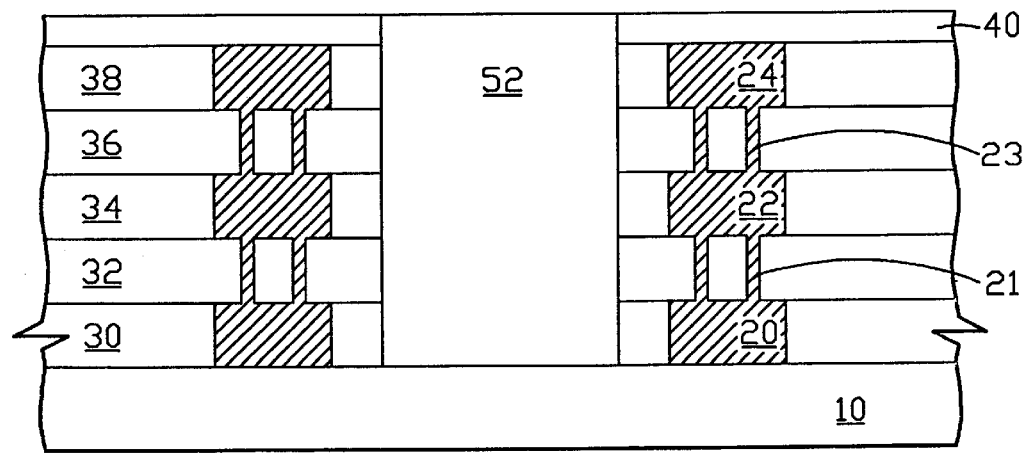
Figure 5:
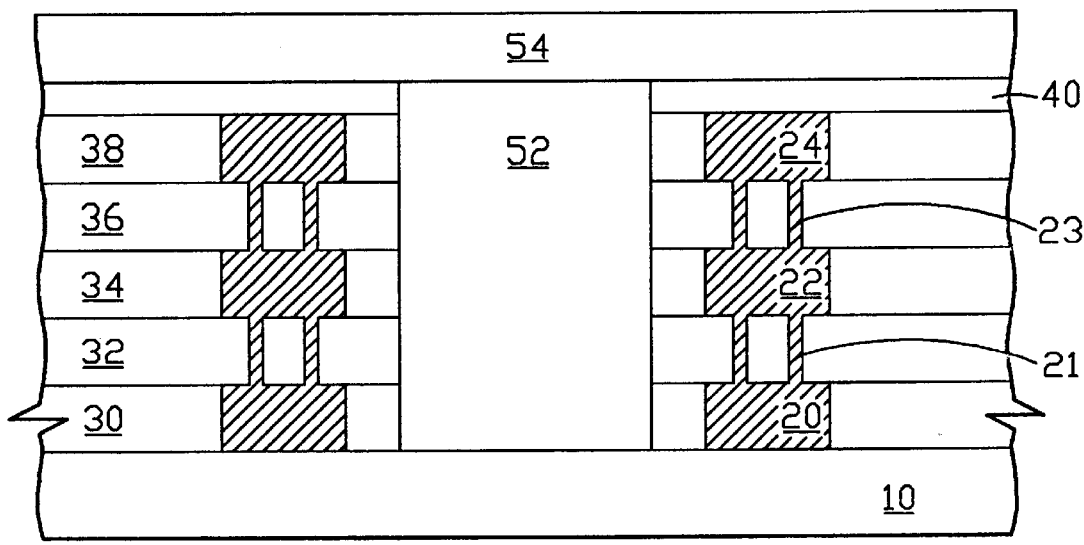
Figure 6:
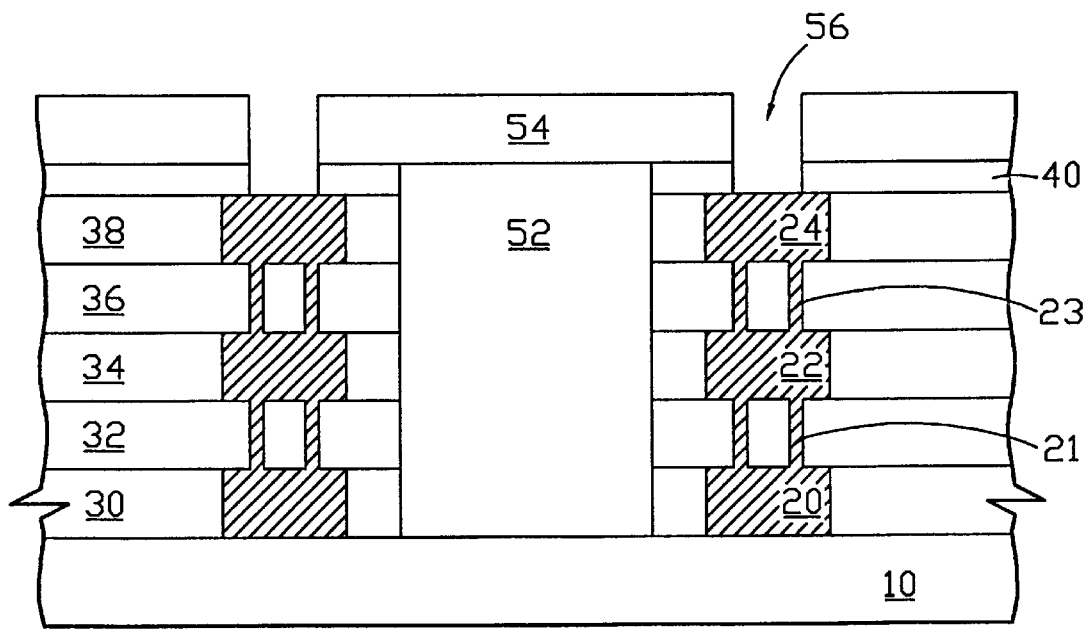

Referring to FIG. 4, the first oxide layer 52 is planarized to the level of the dielectric layer 40 by a chemical mechanical polishing method. Subsequently, and referring to FIG. 5, a second oxide layer 54 with a thickness 1000 angstroms is formed over the planarized first oxide layer 52. The second oxide layer 54 is patterned by photolithography and an etching method to form a plurality of openings 56 within the second oxide layer 54 each of which are formed on each of the top interconnection lines 24, as shown in FIG. 6.

Figure 7:
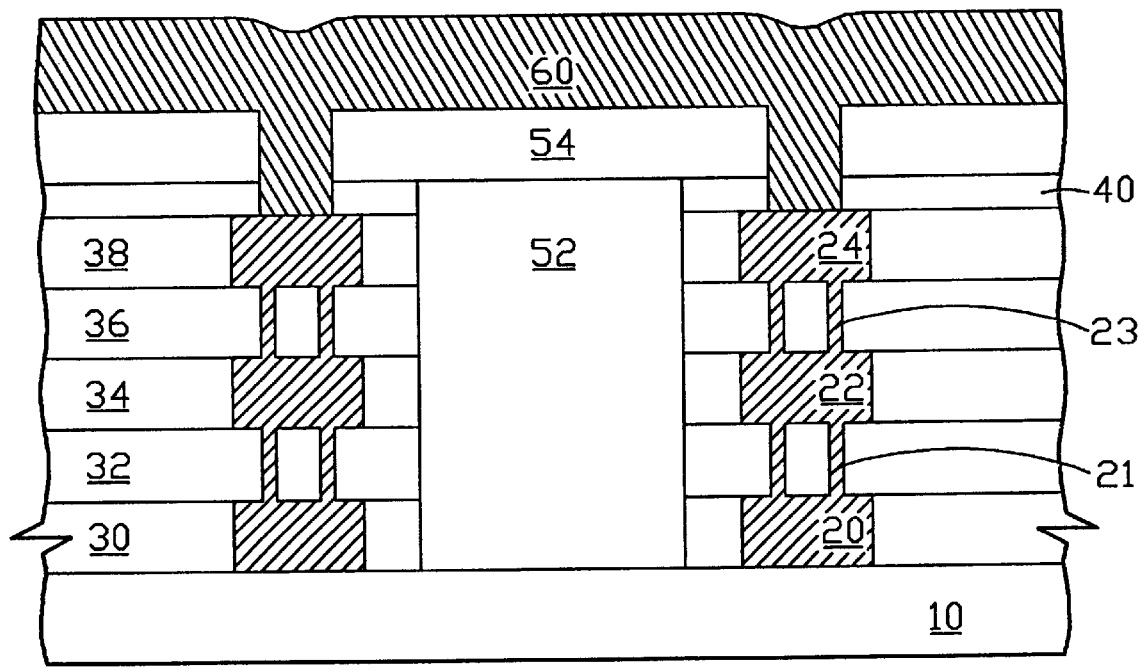
Figure 8:
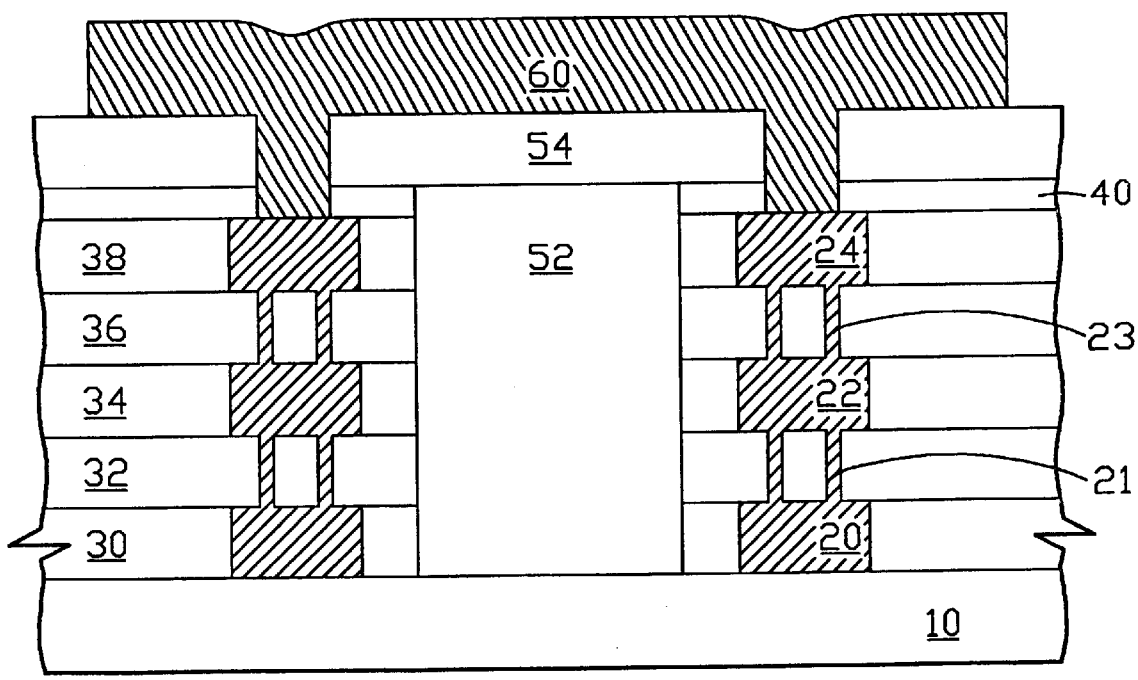

Referring to FIG. 7, a conductive layer 60 with a thickness about 5000 angstroms is formed over the patterned second oxide layer 54 to fill the openings 56 and thus to form a plurality of plugs. The conductive layer 60 can be formed by sputtering or CVD aluminum, CVD copper and aluminum/copper alloy. Finally, and referring to FIG. 8, the conductive layer 60 is patterned to form a conductive pad across over each pair of the plugs by way of photolithography and etching method.

In view of the foregoing, one portion of the low K inter-metal dielectric within the bond structure formed of the multi-level interconnection lines and via layers is substituted by the first oxide, such as silicon dioxide. The first oxide is hard enough to resist the force of the package bonding of the bond structure. Additionally, the poor adhesion between the multi-level interconnection lines and the low K inter-metal dielectric is also improved, and thus the bond structure can endure the pulling force from the package equipment during proceeding package bonding.

The preferred embodiment is only used to illustrate the present invention, and is not intended to limit the scope thereof. Many modifications of the preferred embodiment can be made without departing from the spirit of the present invention.

What is claimed is:

1. A method for improving package bonding between multi-level interconnection lines and low K inter-metal dielectric, said method comprising:

providing a semiconductor substrate with a layered structure having a top interconnection line layer, a bottom interconnection line layer and a plurality of alternative interconnection line layers and via layers formed therebetween, each of said vias being in alignment with one adjacent upper interconnection line and one adjacent lower interconnection line, wherein a low K dielectric material is filled in said layered structure as an inter-metal dielectric;

patterning said layered structure to form a trench between each pair of said adjacent interconnection lines on one layer of said layered structure;

forming a first oxide layer over said layered structure to fill said trench formed therein and then planarizing said first oxide layer;

forming a second oxide layer over said first oxide layer;

patterning said second oxide layer to form a plurality of openings each of which being in alignment with each of said top interconnection lines;

forming a conductive layer over said second oxide layer to fill said openings to form a plurality of plugs; and patterning said conductive layer to form a conductive pad across over each pair of said plugs formed within said second oxide layer.

2. The method of claim 1, wherein further comprises forming a dielectric layer over said top interconnection line layer.

3. The method of claim 2, wherein said dielectric layer is formed of silicon nitride.

4. The method of claim 2, wherein said dielectric layer is formed of silicon oxynitride (SiON).

5. The method of claim 1, wherein said interconnection line is formed of copper.

6. The method of claim 1, wherein said via is filled with copper.

7. The method of claim 1, wherein said low K dielectric comprises a spin-on low K organic polymer.

8. The method of claim 7, wherein said spin-on low K organic polymer is flare.

9. The method of claim 7, wherein said spin-on low K organic polymer is silk.

10. The method of claim 7, wherein said spin-on low K organic polymer is parylene.

11. The method of claim 1, wherein said low K dielectric comprises low K spin-on glass.

12. The method of claim 1, wherein said first oxide layer comprises a silicon dioxide layer formed by chemical vapor deposition (CVD).

13. The method of claim 12, wherein said silicon dioxide layer is formed by low pressure CVD method, utilizing $TEOS/O_3$ as reaction gas at temperature of 650~750° C.

14. The method of claim 1, wherein said first oxide layer is planarized by chemical mechanical polishing method.

15. The method of claim 1, wherein said second oxide layer comprises a silicon oxide layer with a thickness about 1000 angstroms, formed by CVD method.

16. The method of claim 15, wherein said silicon dioxide layer is formed by low pressure CVD method, utilizing $TEOS/O_3$ as reaction gas at temperature of 650~750° C.

17. The method of claim 1, wherein said conductive layer comprises aluminum.

18. The method of claim 1, wherein said conductive layer comprises aluminum/copper alloy.

19. A method for improving package bonding for copper/low K dielectric dual damascene process, said method comprising:

providing a semiconductor substrate with a layered structure having a top copper line layer, a bottom copper line layer and a plurality of alternative copper line layers and via layers each of via filled with copper formed therebetween, each of said vias being in alignment with one adjacent upper copper line and one adjacent lower copper line, wherein said layered structure is formed by a dual damascene process, and a low K dielectric is filled in said layered structure as an inter-metal dielectric;

patterning said layered structure to form a trench between each pair of said copper lines on one layer of said layered structure;

forming a first oxide layer over said layered structure to fill said trench formed therein and then planarizing said first oxide layer;

forming a second oxide layer over said first oxide layer;

patterning said second oxide layer to form a plurality of openings each of which being in alignment with each of said top copper lines;

forming a conductive layer over said second oxide layer to fill said openings to form a plurality of plugs; and patterning said conductive layer to form a conductive pad across over each pair of said plugs.

20. The method of claim 19, wherein further comprises forming a dielectric layer over said top copper line layer.

21. The method of claim 20, wherein said dielectric layer is formed of silicon nitride.

22. The method of claim 20, wherein said dielectric layer is formed of silicon oxynitride (SiON).

23. The method of claim 19, wherein said first oxide layer comprises a silicon dioxide layer formed by chemical vapor deposition (CVD).

24. The method of claim 23, wherein said silicon dioxide layer is formed by low pressure CVD method, utilizing $TEOS/O_3$ as reaction gas at temperature of 650~750° C.

25. The method of claim 19, wherein said first oxide layer is planarized by chemical mechanical polishing method.

26. The method of claim 19, wherein said second oxide layer comprises a silicon oxide layer with a thickness about 1000 angstroms, formed by CVD method.

27. The method of claim 26, wherein said silicon dioxide layer is formed by low pressure CVD method, utilizing $TEOS/O_3$ as reaction gas at temperature of 650~750° C.

28. The method of claim 19, wherein said conductive layer comprises aluminum.

29. The method of claim 19, wherein said conductive layer comprises aluminum/copper alloy.

30. The method of claim 19, wherein said low K dielectric comprises low K spin-on glass.

* * * * *